US009116189B2

(12) United States Patent
Zelder et al.

(10) Patent No.: US 9,116,189 B2
(45) Date of Patent: Aug. 25, 2015

(54) MEASURING SYSTEM FOR DETERMINING SCATTER PARAMETERS

(75) Inventors: Thomas Zelder, Luneberg (DE); Bernd Geck, Hannover (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 234 days.

(21) Appl. No.: 13/122,504

(22) PCT Filed: Sep. 29, 2009

(86) PCT No.: PCT/EP2009/007010
§ 371 (c)(1),
(2), (4) Date: Apr. 4, 2011

(87) PCT Pub. No.: WO2010/046017
PCT Pub. Date: Apr. 29, 2010

(65) Prior Publication Data
US 2011/0241712 A1    Oct. 6, 2011

(30) Foreign Application Priority Data

Oct. 20, 2008 (DE) .................... 20 2008 013 982 U

(51) Int. Cl.
*G01R 31/00* (2006.01)
*G01R 27/28* (2006.01)
(52) U.S. Cl.
CPC ...................................... *G01R 27/28* (2013.01)
(58) Field of Classification Search
CPC .......... G01R 1/06794; G01R 31/2891; G01R 27/28; G01R 31/2887
USPC ....................... 324/750.16–750.25
See application file for complete search history.

(56) References Cited

U.S. PATENT DOCUMENTS

| 4,544,889 | A |   | 10/1985 | Hendriks |
| 5,130,554 | A | * | 7/1992 | Nose et al. ................ 250/548 |
| 5,550,482 | A | * | 8/1996 | Sano ..................... 324/750.19 |
| 5,596,283 | A | * | 1/1997 | Mellitz et al. ........... 324/750.22 |
| 5,635,848 | A | * | 6/1997 | Hammond et al. ....... 324/750.22 |
| 5,705,814 | A | * | 1/1998 | Young et al. ................. 850/2 |

(Continued)

FOREIGN PATENT DOCUMENTS

DE    20 2008 009469 U1    9/2008

OTHER PUBLICATIONS

Chun-Ping Chen, et al., "Compact Magnetic Loop Probe for Microwave Em Field-Mapping and Its Applications in Dielectric Constant Measurement", Proceedings of the 37th European Microwave Conference, Oct. 2007, pp. 226-229, Munich, Germany.

(Continued)

*Primary Examiner* — Patrick Assouad
*Assistant Examiner* — Demetrius Pretlow
(74) *Attorney, Agent, or Firm* — DeLio, Peterson & Curcio LLC; Robert Curcio

(57) ABSTRACT

A measuring system for determining scatter parameters of an electrical measurement object on a substrate, having a measuring machine having at least one measuring channel and at least one measuring probe electrically connected to at least one measuring channel and designed for non-contacting or contacting connection to an electrical signal line of the electrical measurement in the electronic circuit. A first positioning device is provided for at least one measuring probe, wherein at least one sensor detects a position of at least one measuring probe and outputs a position signal.

13 Claims, 1 Drawing Sheet

(56) References Cited

U.S. PATENT DOCUMENTS

| | | | |
|---|---|---|---|
| 6,097,473 A * | 8/2000 | Ota et al. | 355/53 |
| 6,118,284 A * | 9/2000 | Ghoshal et al. | 324/754.29 |
| 6,239,590 B1 * | 5/2001 | Krivy et al. | 324/750.02 |
| 6,861,858 B2 * | 3/2005 | Chen et al. | 324/750.16 |
| 6,871,307 B2 * | 3/2005 | Nachumovsky | 714/718 |
| 6,973,406 B2 * | 12/2005 | Zemer et al. | 702/118 |
| 7,042,236 B1 * | 5/2006 | Wollitzer | 324/755.02 |
| 7,068,056 B1 * | 6/2006 | Gibbs et al. | 324/750.16 |
| 7,119,560 B2 * | 10/2006 | Nihei et al. | 324/750.19 |
| 7,183,759 B1 * | 2/2007 | Malendevich et al. | 324/750.22 |
| 7,297,945 B2 * | 11/2007 | Hazaki et al. | 250/306 |
| 7,321,233 B2 * | 1/2008 | Strid et al. | 324/750.26 |
| 7,348,786 B2 * | 3/2008 | Thacker et al. | 324/755.07 |
| 7,412,138 B1 * | 8/2008 | Malendevich et al. | 385/52 |
| 7,486,089 B2 * | 2/2009 | Abe | 324/750.22 |
| 7,560,943 B2 * | 7/2009 | Kim et al. | 324/750.16 |
| 7,960,981 B2 * | 6/2011 | Strom et al. | 324/750.23 |
| 7,977,956 B2 * | 7/2011 | Breinlinger et al. | 324/750.16 |
| 2001/0050572 A1 * | 12/2001 | Nishikawa et al. | 324/761 |
| 2003/0141889 A1 * | 7/2003 | Chen et al. | 324/765 |
| 2003/0173951 A1 * | 9/2003 | Suzuki | 324/158.1 |
| 2005/0017708 A1 * | 1/2005 | Miller et al. | 324/158.1 |
| 2005/0083073 A1 * | 4/2005 | Nihei et al. | 324/758 |
| 2005/0179455 A1 * | 8/2005 | Cooper et al. | 324/754 |
| 2005/0193576 A1 * | 9/2005 | Hollman et al. | 33/286 |
| 2006/0103403 A1 * | 5/2006 | Strid et al. | 324/754 |
| 2006/0109015 A1 * | 5/2006 | Thacker et al. | 324/754 |
| 2006/0255814 A1 * | 11/2006 | Eldridge et al. | 324/754 |
| 2006/0267613 A1 * | 11/2006 | Takahashi et al. | 324/758 |
| 2007/0007978 A1 * | 1/2007 | Parker et al. | 324/754 |
| 2007/0024293 A1 | 2/2007 | Kosaka | |
| 2007/0096763 A1 * | 5/2007 | Ehrmann et al. | 324/765 |
| 2007/0124932 A1 * | 6/2007 | Hosaka et al. | 29/874 |
| 2007/0170941 A1 * | 7/2007 | Cooper et al. | 324/754 |
| 2007/0176612 A1 * | 8/2007 | Sakata | 324/754 |
| 2007/0262767 A1 * | 11/2007 | Cooper et al. | 324/73.1 |
| 2007/0296427 A1 * | 12/2007 | Kono | 324/754 |
| 2008/0018342 A1 * | 1/2008 | Hiebel | 324/601 |
| 2008/0048699 A1 * | 2/2008 | Hazaki et al. | 324/758 |
| 2008/0061232 A1 * | 3/2008 | Iyoki et al. | 250/306 |
| 2008/0150565 A1 * | 6/2008 | Nayak et al. | 324/758 |
| 2008/0231300 A1 * | 9/2008 | Yamada et al. | 324/758 |
| 2008/0315903 A1 * | 12/2008 | Schmidt et al. | 324/758 |
| 2009/0102494 A1 * | 4/2009 | Miller | 324/750 |
| 2009/0184721 A1 * | 7/2009 | Albert-Lebrun et al. | 324/601 |

OTHER PUBLICATIONS

Chen, Chun-Ping; Compact Magnetic Loop Probe for Microwave Em Field-Mapping and Its Applications in Dielectric Constant Measurement; Proceedings of the 37th European Microwave Conference—2007; pp. 226-229.

* cited by examiner

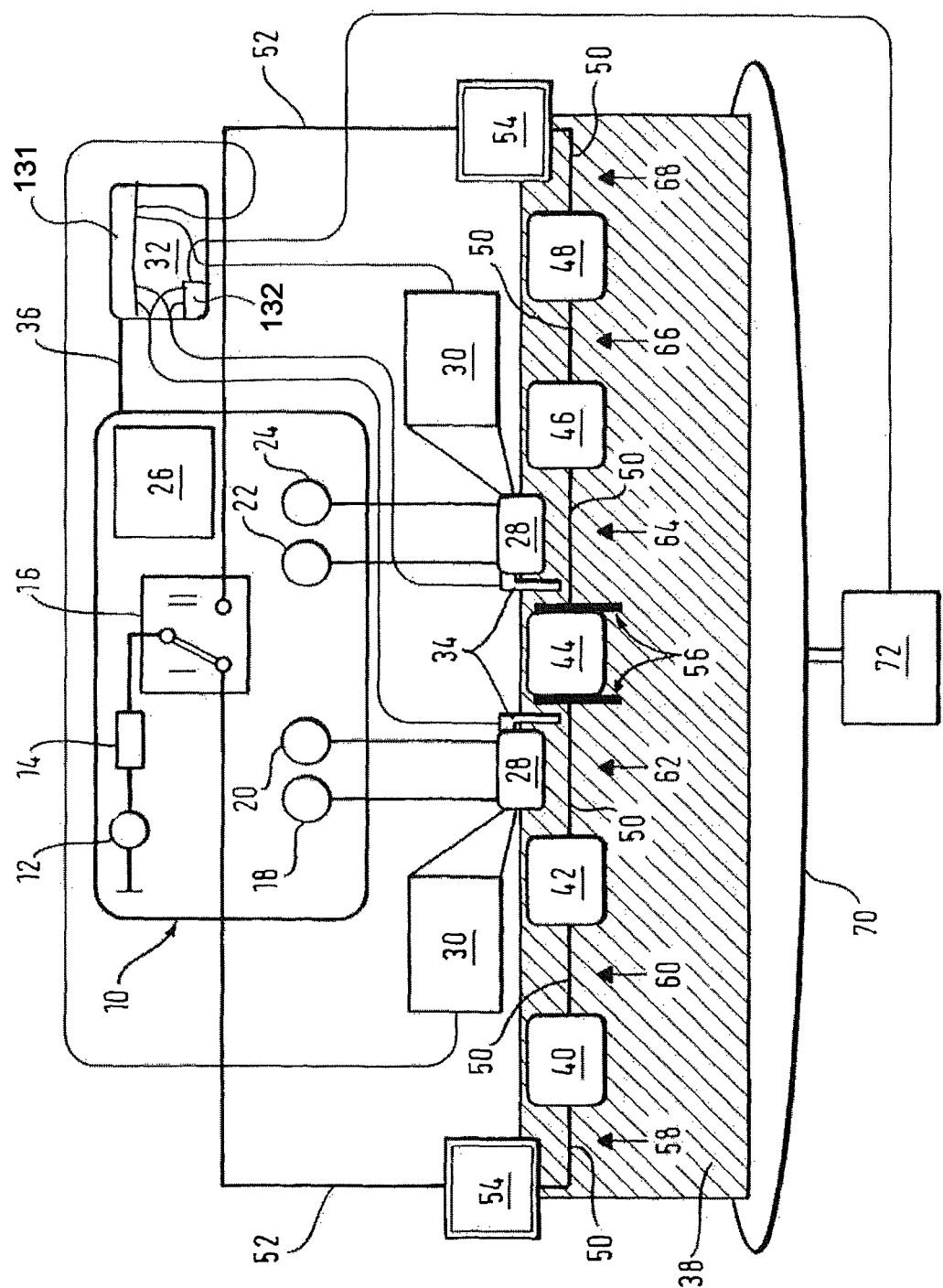

MEASURING SYSTEM FOR DETERMINING SCATTER PARAMETERS

This application is a National Stage filing based on PCT/EP2009/007010, filed Sep. 29, 2009, and which claims priority to German Patent Application No. DE 20 2008 013 982.1, filed Oct. 20, 2008.

BACKGROUND OF THE INVENTION

1. Field of the Invention

The present invention relates to a measuring system for determining scattering parameters of an electrical device under test on a substrate, having a measuring device which has at least one measuring channel and at least one measuring probe which is electrically connected to at least one measuring channel and which is designed for contacting, with or without physical contact, an electrical signal guide belonging to the electrical device under test in the electronic circuit.

2. Description of Related Art

In for example the development of complex planar microwave circuits which are made up of a plurality of sub-circuits, it is useful for the scattering parameters to be determined separately for each sub-circuit or if necessary for individual electronic components. In this way, it is possible for the performance of the various sub-circuits or electronic components to be analyzed and checked individually. The determination of the scattering parameters of an electrical device under test (DUT) which is embedded in a circuit is performed with a modified vector network analyzer (VNA). The accuracy of measurement of the non-contacting vector network analyzer depends chiefly on the repeatability with which the measuring probe can be positioned. By using an automatic on-wafer probe and a motorized probe head, it is possible to set the position of the non-contacting probe, and specifically the distance away of the probe, relative to a planar substrate for measurement.

To enable embedded DUT's to be characterized, the non-contacting probes or the DUT's have to be shifted in position. When this is done, it is necessary for the probes to assume the same positions (in the x, y and z directions) relative to the supply lines to the DUT's or the calibrations standards when measurements are being made on all the DUT's or the calibration standards. Due to unevenness in the planar substrate for measurement, to the coupling probes being obliquely positioned, and so on, it is difficult to ensure that the probes are repeatably positioned. The accuracy of measurement depends on the accuracy of positioning.

SUMMARY OF THE INVENTION

Bearing in mind the problems and deficiencies of the prior art, it is therefore an object of the present invention to improve a measuring system of the above-mentioned kind in respect of the accuracy of measurement and repeatability of the results of the measurement process.

This object is achieved in accordance with the invention by a measuring system of the above-mentioned kind which has the features and embodiments identified in the claims.

Still other objects and advantages of the invention will in part be obvious and will in part be apparent from the specification.

The above and other objects, which will be apparent to those skilled in the art, are achieved in the present invention which is directed to a measuring system for determining scattering parameters of an electrical device under test on a substrate, comprising: a measuring device including at least one measuring channel and at least one measuring probe connected to the at least one measuring channel and which is designed for contacting, with or without physical contact, an electrical signal guide belonging to the electrical device under test in the electronic circuit; a first positioner being provided for the at least one measuring probe, the first positioner having a motorized drive; at least one sensor for detecting a position of at least one measuring probe and emitting a position signal; at least one first control unit connecting to the sensor to receive the position signal therefrom and actuating at least the first positioner in such a way that the at least one measuring probe whose position is detected by the sensor is situated in a predetermined position in space relative to the electrical device under test; at least one second positioner having a motorized drive and receiving the substrate mechanically; at least one second control unit for actuating the at least one second positioner; a data path for transmitting positional data from the at least one sensor to the at least one second control unit; a data transmission path for transmitting data between the measuring device and at least one control unit; the first and second control units being integrated into a single control unit, the at least one sensor detecting a position of the at least one measuring probe relative to a position mark on the electronic circuit or the substrate and emitting a position signal to this effect to the at least one first control unit.

The at least one sensor may include an optical, electro-optical, electrical, acoustic, infrared, electrostatic, or magnetic sensor, or any combination thereof. The measuring device may include a modified vector network analyzer, the measuring channels being connected directly to the measuring probes via connecting lines. At least one measuring probe may form a point probe or loop probe for coupling signals capacitively or inductively or both.

The electrical device under test may be embedded in an electronic circuit formed on the substrate and may comprise one or more electronic components which are connected together electrically.

The electrical device under test may be a calibration standard.

At least one sensor may be fastened mechanically to the at least one measuring probe, and may be displaceable in space independently of the substrate.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 depicts a preferred embodiment of the measuring system of the present invention.

DESCRIPTION OF THE PREFERRED EMBODIMENTS(S)

In describing the preferred embodiment of the present invention, reference will be made herein to FIG. 1 of the drawings in which like numerals refer to like features of the invention.

In a measuring system of the above-mentioned kind, provision is made in accordance with the invention for a first positioning arrangement to be provided for at least one measuring probe, at least one sensor being provided which detects a position of at least one measuring probe and emits a position signal.

This had the advantage that exact and repeatable positioning of the measuring probe relative to the electrical device under test is achieved, which gives a high accuracy of measurement for the measurement of scattering parameters or in other words for vector network analysis.

In a preferred embodiment, at least one first control unit is provided which is connected to the sensor to receive the position signal therefrom and which is so designed that the first control unit actuates at least one first positioning arrangement in such a way that the measuring probe whose position is detected by the sensor is situated in a predetermined position in space relative to the electrical device under test.

The first positioning arrangement usefully has a manual or motorized drive.

In a preferred embodiment, at least one sensor is an optical, electro-optical, electrical, acoustic, infrared, electrostatic and/or magnetic sensor.

The measuring device is usefully a modified vector network analyzer in which the measuring probes are electrically connected directly to the receivers or measuring channels via a connecting line.

The measuring probe is for example in the form of a probe or loop probe which couples capacitively and/or inductively.

For the additional exact positioning of the electronic circuit, within the measuring system there is provided at least one second positioning arrangement which is driven manually or by a motor and which is designed to receive the electronic circuit mechanically.

At least one control unit is usefully provided to actuate the second positioning arrangement, at least one data path or at least one data line being provided as an option to transmit positional data from at least one sensor to at least one second control unit. The first and second control units are for example integrated into a single control unit.

In a preferred embodiment, the at least one sensor detects an absolute position of the measuring probe in space, a position of the measuring probe relative to the electrical device under test, a position of the measuring probe relative to a position mark on the electronic circuit, or a position of the measuring probe relative to a signal line between the electrical device under test and the rest of the electronic circuit, or any combination thereof, and emits a position signal to this effect to at least one first control unit.

Because a data transmission path is provided for transmitting data between the measuring device and at least one control unit, the control unit receives in addition data for the positioning of the associated measuring probe from the measuring device and the measuring device receives information on whether the measuring probe is correctly positioned, thus enabling a measurement to start or a measured value to be assessed as a function of the positional data.

The electrical device under test is a calibration standard or is an electrical device under test (DUT) which is embedded in an electronic circuit formed on the substrate and which comprises one or more electronic components which are connected together electrically.

Usefully, at least one sensor is fastened mechanically to at least one measuring probe.

To enable one sensor to be used for a plurality of measuring probes for example, the sensor is so arranged that it is displaceable in space independently of the substrate.

In a preferred embodiment, a mark is arranged on the substrate, the sensor being designed to sense a position relative to this mark.

The invention will be explained in detail in what follows by reference to the drawings. FIG. 1 depicts a preferred embodiment of the measuring system according to the invention.

The preferred embodiment of the measuring system according to the invention which is shown by way of example in FIG. 1 comprises a modified vector network analyzer 10 having a generator 12, an impedance Zg 14, a switch 16, measuring channels 18, 20, 22 and 24 and a computer 26. Other than as in a conventional VNA, in the modified VNA the measuring channels 18, 20, 22, 24 are electrically connected directly to two measuring probes 28. Each measuring probe 28 is arranged on a first positioning arrangement 30 in the form of an XYZ motor, such that the first positioning arrangement 30 is designed for the positioning of the given measuring probe 28 in three dimensions in space. The first positioning arrangements 30 are connected to a shared control unit 32 which actuates the first positioning arrangements 30 for the appropriate positioning of the measuring probes 28. Also provided are two position-measuring sensors 34 which are connected to the control unit 32. The sensors 34 are connected to respective ones of the measuring probes 28 and are used to detect a position of the measuring probes 28 in space. The measuring probes emit to the control unit 32 a position signal to this effect which specifies a position of the given measuring probe. The control unit 32 actuates the first positioning arrangements 30 as a function of these position signals from the sensors 34 in such a way that the measuring probes 28 are positioned exactly in predetermined positions in space. A data line 36 which is connected on the one hand to the modified vector network analyzer 10, or rather to the computer 26 arranged therein, and on the other hand to the control unit 32, is used for the exchange of data between the modified vector network analyzer 10 and the control unit 32.

Formed on a substrate 38 is an electronic circuit which has a plurality of electrical devices (to be) under test 40, 42, 44, 46, 48 which are embedded in the electronic circuit. These electrical devices (to be) under test 40, 42, 44, 46, 48 form, at given respective times, the device under test (DUT) whose scattering parameters are to be determined by the modified vector network analyzer 10. The electrical devices (to be) under test 40, 42, 44, 46, 48 are connected together by respective signal guides 50. The electronic circuit having electrical devices (to be) under test 40, 42, 44, 46, 48 and signal guides 50 takes the form for example of a planar circuit on the substrate 38. To allow the scattering parameters of the DUT 44 to be measured, the measuring probes 28 are arranged on the two sides of the DUT 44 in the near field of those signal guides 50 by which the DUT 44 is connected to the rest of the electronic circuit. The generator 12 is connected to the electronic circuit by the impedance 14, the switch 16, respective waveguides 52 and transitions 54 to respective signal guides 50 and feeds appropriate test signals into the electronic circuit.

Reference numeral 56 designates reference planes, 58 designates a first position on the substrate 38, 60 designates a second position on the substrate 38, 62 designates a third position on the substrate 38, 64 designates a fourth position on the substrate 38, 66 designates a fifth position on the substrate 38 and 68 designates a sixth position on the substrate 38. To allow the scattering parameters of the DUT 44 to be determined, the measuring probes 28 are arranged at the third position 62 and the fourth position 64. To enable the scattering parameters of the DUT 40 for example to be measured, the two non-contacting measuring probes 28 have to be displaced to the first position 58 and the second position 60.

The sensors 34 detect a position of the measuring probes 28 relative to the signal guides 50. Position marks for example are formed on the substrate 38 for this purpose. If the relevant position signal from the sensors 34 indicates a deviation from the desired position in the near-field region of the signal guides 50, the control unit 32 actuates the positioning arrangements 30, independently of one another, in such a way that both the measuring probes 28 are arranged exactly at the desired position in the near field of the signal guides 50 of the DUT 44. Because of this controlled positioning or adjustment of the measuring probes 28 by means of the sensors 34 and the control unit 32, positions in question can be homed in on with repeatable exactness even on a plurality of substrates 38 of identical construction. Alternatively or in addition, the substrate 38 may have, in a known manner, calibration standards having respective signal guides, for calibrating the non-contacting measuring system. The measuring probes are then positioned at a predetermined position, which can be homed in on with repeatable exactness, in the near field of the signal guides of whichever calibration standard is involved.

The substrate 38 is arranged in addition on a positioning table 70 which is positioned by a second positioning arrangement 72 in the form of an XYZ motor, i.e., which is positioned in three directions in space. The second positioning arrangement 72 is connected to the control unit 32, the control unit 32 actuating the second positioning arrangement 72 too as a function of the position signals from the sensors 34 and adjusting the position in space of the substrate 38 present on the positioning table 70 accordingly such that the result is a minimized difference between the desired position of the measuring probes 28 and the actual position thereof detected by the sensors 34, such that the result is the desired position of the measuring probes 28 relative to the signal guides 50.

The sensors 34 operate for example mechanically, electrically, optically (e.g., using lasers), electro-optically, acoustically, by infrared means, and the like, to enable the position of an associated measuring probe 28, or a deviation in its position, to be detected. In so doing, the sensor transmits the full position to the control unit 32 or only reports when a given position is reached. Rather than by means of the control unit 32, the sensor may also communicate the item or items of positional information to the user by an audio signal, a display, and the like. By the control unit 32, the re-adjustment of the positions of the probes is performed manually or fully automatically after a change in position.

The non-contacting measuring system which is shown by way of example comprises at least one measuring channel 18, 20, 22, 24, at least one generator 12 and at least one measuring probe 28 whose position in space is lined up relative to at least one supply line 50 connected to the DUT 44 or calibration standard by at least one positioning arrangement 30 operating in three dimensions, the positioning arrangement 30 changing or setting the position in three dimensions of the substrate for measurement 38 or calibration substrate, or the position in three dimensions of the measuring probe, independently of one another, or any combination thereof. At least one measuring probe 28 is connected to at least one measuring channel 18, 20, 22, 24 for the detection of the measured values via a signal path. The signal path comprises, amongst other things, an amplifier, a bias, and a wave guide for example. The measuring probe 28 preferably takes the form of a non-contacting measuring probe 28, the non-contacting measuring probe 28 being a purely inductive or capacitive probe 28 or a combination of the two. Alternatively, the measuring probe 28 takes the form of a contacting probe 28, such for example as an on-wafer probe, which makes electrical contact on the calibration substrate or substrate for measurement 38 with the supply lines of the calibration standard or of the DUT situated coupling structures. The contacting probes 28 contact the supply lines 50 of the DUT directly.

The signal from the generator is fed to a waveguide via the change-over switch 16. The waveguide is electrically connected to the planar calibration substrate or substrate for measurement 38 via the waveguide transition 54, such for example as an on-wafer probe or PCB probe or coaxial-planar transitions. By the use of the change-over switch 16, the signal energy can be fed to different points on the calibration substrate or substrate for measurement 38. By means of the calibration substrate, on which there are calibration standards which are known or of which some are known, and conventional methods of calibration such for example as the TRL (thru-reflect line), the measuring unit can be calibrated, or in other words the errors of measurement can be corrected. The measured values, which are complex values, are coupled out from the supply lines 50 of the calibration standard or the DUT 44 by the non-contacting measuring probes 28 and are fed by waveguides to at least one measuring channel 18, 20, 22, 24 per port of the device under test. The measuring channels 18, 20, 22, 24 are receivers which receive and digitize the complex measurement signals. The analysis of the measured values then takes place in the modified vector network analyzer (VNA) 10 or in an internal or external PC 26. This has the advantage that embedded devices under test can be exactly characterized. The measurement channels are for example vectorial. Vectorial means that they are able to detect the complex measurement signal. They may however equally well be non-vectorial, wherein it is only the magnitude or the phase or the real or imaginary part of the measurement signal which is measured. Per port for measurement, two vectorial measurement channels (a two-measurement-point VNA) or four channels for real-part measurements (power detectors, six-port reflectometers) are used for example.

The non-contacting measuring probe 28 comprises for example a plurality of individual non-contacting measuring probes. The DUT 40, 42, 44, 46, 48 may be connected to a plurality of waveguides 50 (supply lines), at least one measuring probe 28 being positioned in the near field of each supply line 50. The position of each individual measuring probe 28 relative to a given supply line 50 can be set repeatably by means of the positioning arrangement. The setting of position is performed by the control unit 32 for the measuring probes 28 or the substrate for measurement 38.

The re-adjustment is performed manually or automatically. If a plurality of probes 28 is used, it is particularly advantageous for all the probes 28 to be re-adjusted in respect of their positions independently of one another. The three-dimensional re-adjustment is for example performed automatically with the help of the sensors 34. Electrical, mechanical, optical, or other sensors 34 are used in this case. As an option, there may in addition be auxiliary structures present on the substrate for measurement for the purposes of position detection. The signals which are emitted by the sensors 34 are analyzed by the control unit 32 and converted into control signals for the positioning arrangements 30.

The sensors 34 are for example part of the non-contacting probes 28 or are independent thereof. Examples of sensors are microscopes, laser-assisted distance sensors, resilient butt contacts, or the like.

Alternatively, the re-adjustment of the position of the measuring probes 28 is carried out in repeated measurements and analysis thereof at a plurality of positions, a given analyzing algorithm being used for this purpose. For automated re-adjustment, the control unit 32 is preferably used. For manual re-adjustment, such as re-adjustment of position by the user by hand, the control unit 32 is not needed. Since, to reduce the measurement errors, it makes good sense for all N probe positions relative to the supply lines 50 of the respective DUT's 40, 42, 44, 46, 48 to be controlled independently of one another to allow a device under test having N ports to be characterized, N independent control units 32 are preferably provided. N−1 control units are for example connected to N−1 probes 28 and one control unit is connected to the positioning table 70.

In an illustrative embodiment, position marks which are detected and processed by a sensor, e.g., a camera, are situated on the calibrating substrate or substrate for measurement 38. The positions of the non-contacting probes 28 are re-adjusted until such time as the desired positions are reached relative to the position marks.

The transitions 54 (such as on-wafer probes for example) make the transition from the waveguides of the generator 12 to the waveguides 50 of the calibration substrate or substrate for measurement 38. The positions of the transitions 54 are for example set with a control unit automatically or by hand. As an option, these transitions 54 take the form of contacting measuring probes and the at least one sensor 34 also detects the position of at least one transition 54, and at least one positioning arrangement also positions a transition 54 relative to the substrate 38 and/or the substrate 38 relative to at least one transition 54.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention,
What is claimed is:

1. A measuring system for determining scattering parameters of an electrical device under test on a substrate, comprising:
    a measuring device including at least one measuring channel and measuring probes connected to said at least one measuring channel and which are designed for contacting, with or without physical contact, an electrical signal guide belonging to the electrical device under test in the electronic circuit;
    a first positioner being provided for each of said measuring probes, for positioning the measuring probes in three dimensions in space, said first positioners having a motorized drive;
    at least one sensor for each of said measuring probes for detecting an absolute position of the measuring probe in space, a position of the measuring probe relative to the electrical device under test, a position of the measuring probe relative to a position mark on an electronic circuit, or a position of the measuring probe relative to a signal line between the electrical device under test and the rest of the electronic circuit, or any combination thereof, and emitting a position signal to this effect to at least one first control unit;
    at least one first control unit connecting to the sensors to receive the position signals therefrom and actuating the first positioners in such a way that the measuring probes whose positions are detected by the sensors are situated in predetermined positions in space relative to the electrical device under test;
    at least one second positioner having a motorized drive and receiving the substrate mechanically for positioning the substrate in three directions in space;
    at least one second control unit for actuating the at least one second positioner;
    a data path for transmitting positional data from said sensors to said at least one second control unit;
    a data transmission path for transmitting data between the measuring device and said at least one first or second control unit;
    the first and second control units being integrated into a single control unit, the sensors detecting a position of the measuring probes relative to a position mark on the electronic circuit or the substrate and emitting a position signal to this effect to said at least one first control unit.

2. The measuring system of claim 1 wherein said at least one sensor includes an optical, electro-optical, electrical, acoustic, infrared, electrostatic, or magnetic sensor, or any combination thereof.

3. The measuring system of claim 1 wherein the measuring device includes a modified vector network analyzer, the measuring channels being connected directly to the measuring probes via connecting lines.

4. The measuring system of claim 1 wherein the measuring probes from a point probe or loop probe for coupling signals capacitively or inductively or both.

5. The measuring system of claim 1 wherein the electrical device under test is embedded in an electronic circuit formed on the substrate and which comprises one or more electronic components which are connected together electrically.

6. The measuring system of claim 1 wherein the electrical device under test is a calibration standard.

7. The measuring system of claim 1 wherein said sensors are fastened mechanically to said measuring probes.

8. The measuring system of claim 1 wherein the sensors are displaceable in space independently of the substrate.

9. The measuring system of claim 3 wherein the measuring probes from a point probe or loop probe for coupling signals capacitively or inductively or both.

10. The measuring system of claim 9 wherein the electrical device under test is embedded in an electronic circuit formed on the substrate and which comprises one or more electronic components which are connected together electrically.

11. The measuring system of claim 5 wherein the electrical device under test is a calibration standard.

12. The measuring system of claim 10 wherein the electrical device under test is a calibration standard.

13. The measuring system of claim 2 wherein the sensors are displaceable in space independently of the substrate.

* * * * *